United States Patent
Saha et al.

(10) Patent No.: US 10,579,082 B2
(45) Date of Patent: Mar. 3, 2020

(54) TEMPERATURE DEPENDENT CURRENT LIMIT CONTROL FOR FAST-CHARGING AND SAFE OPERATING AREA (SOA) PROTECTION

(71) Applicant: TEXAS INSTRUMENTS INCORPORATED, Dallas, TX (US)

(72) Inventors: Aalok Dyuti Saha, Cooch Behar (IN); Bhaskar Ramachandran, Coimbatore (IN); Dattatreya Baragur Suryanarayana, Bengaluru (IN)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 16/208,159

(22) Filed: Dec. 3, 2018

(65) Prior Publication Data

US 2020/0012304 A1 Jan. 9, 2020

(30) Foreign Application Priority Data

Jul. 6, 2018 (IN) .............................. 201841025280

(51) Int. Cl.
*G05F 1/573* (2006.01)
*G05F 1/567* (2006.01)
(Continued)

(52) U.S. Cl.
CPC ..... *G05F 1/5735* (2013.01); *G01R 19/16571* (2013.01); *G05D 23/2034* (2013.01);
(Continued)

(58) Field of Classification Search
CPC . G05F 1/56; G05F 1/567; G05F 1/573; G05F 1/575; G05F 1/5735;
(Continued)

(56) References Cited

U.S. PATENT DOCUMENTS 5,666,043 A * 9/1997 Henry ..................... G05F 1/575
323/277
5,757,172 A * 5/1998 Hunsdorf ................ G05F 1/567
323/277

(Continued)

OTHER PUBLICATIONS

Texas Instruments, "TPS2471x 2.5-V to 18-V High-Efficiency Power-Limiting Hot-Swap Controller," TPS2471 datasheet, Jan. 2011 [Revised Nov. 2015].

(Continued)

*Primary Examiner* — Yemane Mehari
(74) *Attorney, Agent, or Firm* — Tuenlap Chan; Charles A. Brill; Frank D. Cimino

(57) ABSTRACT

An apparatus includes a power transistor to conduct a load current from a supply voltage node to an output node and a current sense circuit coupled to the power transistor. The current sense circuit generates a current sense current proportional to the load current. A temperature sense circuit is included to generate a temperature sense voltage proportional to the temperature of the power FET. A thermal limit circuit is coupled to the temperature sense circuit. A current limit circuit is coupled to the current sense circuit and to the thermal limit circuit. The current limit circuit generates a control signal on a current limit circuit output node. The control signal is responsive to the current sense current and to a first current from the thermal limit circuit. The current limit circuit output node is coupled to a control input of the power transistor.

20 Claims, 6 Drawing Sheets

(51) Int. Cl.
*G01R 19/165* (2006.01)
*G05D 23/20* (2006.01)
*H03F 1/02* (2006.01)
*H03F 1/30* (2006.01)

(52) U.S. Cl.
CPC ............ *G05F 1/567* (2013.01); *H03F 1/0233* (2013.01); *H03F 1/301* (2013.01)

(58) Field of Classification Search
CPC .......... G01R 19/16571; G05D 23/2034; H03F 1/0233; H03F 1/301; H05F 3/24; H02M 3/1584; H02M 1/44; H02M 2001/0032; H02M 2001/0045
USPC ........................................ 323/265, 268, 277
See application file for complete search history.

(56) References Cited

U.S. PATENT DOCUMENTS

| | | | | |
|---|---|---|---|---|
| 5,932,938 | A * | 8/1999 | Shimamori | H02M 3/157 307/125 |
| 8,164,317 | B2 * | 4/2012 | Chiu | H02J 7/0091 323/268 |
| 2004/0178779 | A1 * | 9/2004 | Walters | H02M 3/156 323/277 |
| 2007/0004055 | A1 * | 1/2007 | Ball | H01L 23/34 438/14 |
| 2015/0277456 | A1 * | 10/2015 | Illing | G05F 1/10 323/265 |
| 2018/0159341 | A1 * | 6/2018 | Kadam | H02J 7/045 |

OTHER PUBLICATIONS

Texas Instruments, "TPS2660x 60-V, 2-A Industrial eFuse With Integrated Reverse Input Polarity Protection," TPS2660 datasheet, Jul. 2016 [Revised Nov. 2017].

* cited by examiner

US 10,579,082 B2

TEMPERATURE DEPENDENT CURRENT LIMIT CONTROL FOR FAST-CHARGING AND SAFE OPERATING AREA (SOA) PROTECTION

RELATED APPLICATIONS

This application claims priority to India Provisional Application No. 201841025280 filed Jul. 6, 2018, which is hereby incorporated by reference.

BACKGROUND

Many applications include a power transistor that, upon being turned on, provides supply voltage from a voltage source to a load. An output capacitor may be coupled to or across the load. The output capacitor may help filter noise on the supply voltage to the node. Further, the output capacitor can be charged by the voltage source and then used to provide current to the load in the event of a momentary outage of the supply voltage.

The power transistor dissipates power during the time the output capacitor is being charged. During the output capacitor charge cycle, the power transistor can experience a voltage drop across its current terminals (e.g., drain and source) of tens of volts (e.g., 60 V) and high current through the transistor to the output capacitor of, for example, 2 A. The example of a 60 V drop across the power transistor at 2 A of charge current means that the power transistor in this example will dissipate 120 watts. At that power dissipation level, the internal core temperature of the power transistor will very quickly increase to a dangerous level (dangerous in that the temperature of the power transistor may exceeds its rated temperature value and violate its thermal safe operating area boundary and damage the power transistor).

SUMMARY

In one example, an apparatus includes a power transistor to conduct a load current from a supply voltage node to an output node and a current sense circuit coupled to the power transistor. The current sense circuit generates a current sense current proportional to the load current. A temperature sense circuit is included to generate a temperature sense voltage proportional to the temperature of the power FET. A thermal limit circuit is coupled to the temperature sense circuit. A current limit circuit is coupled to the current sense circuit and to the thermal limit circuit. The current limit circuit generates a control signal on a current limit circuit output node. The control signal is responsive to the current sense current and to a first current from the thermal limit circuit. The current limit circuit output node is coupled to a control input of the power transistor.

BRIEF DESCRIPTION OF THE DRAWINGS

For a detailed description of various examples, reference will now be made to the accompanying drawings in which.

DETAILED DESCRIPTION

Figure 1:
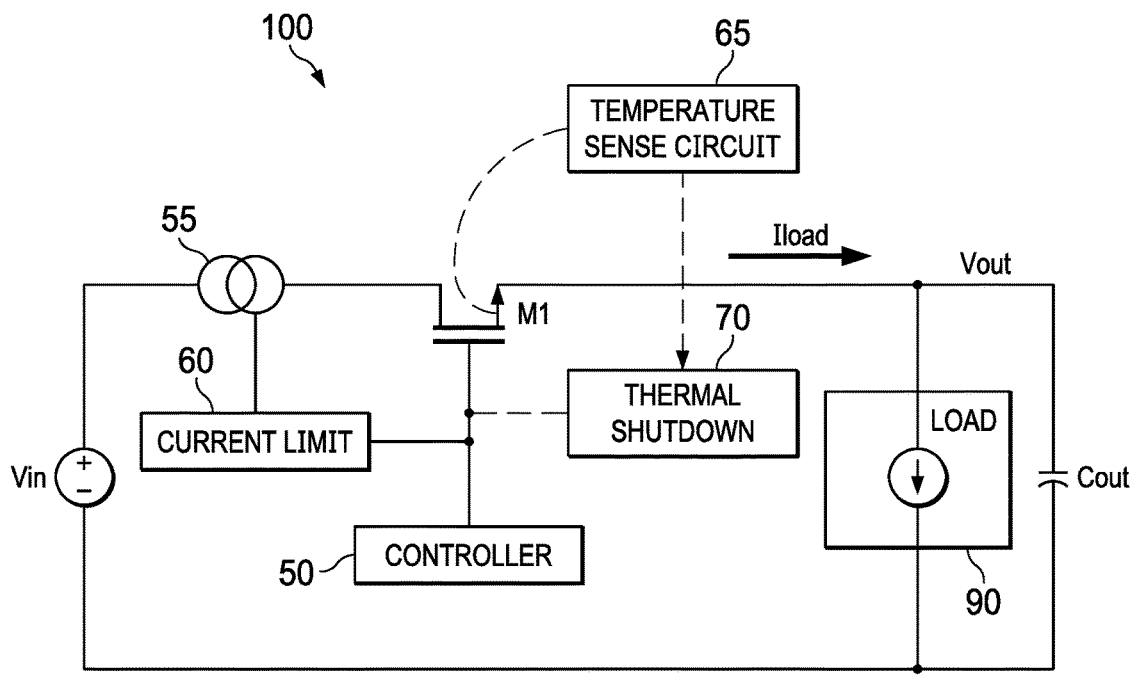
FIG. 1 illustrates a block diagram of a system for providing power to a load and charge current to an output capacitor.

FIG. 1 shows an architecture of a system 100 which includes a voltage source Vin, a power transistor M1, a controller 50, a load current sense circuit 55, a current limit circuit 60, a temperature sense circuit 65, a thermal shutdown circuit 70, a load 90, and an output capacitor Cout. Upon being turned on by the controller 50, current from the voltage source Vin is conducted through M1 to the load 90 and the output capacitor Cout. The load 90 may comprise a constant current load (as illustrated in FIG. 1), a resistive load, or other type of load. The output capacitor Cout is charged by the current from the power transistor M1, and the charge can be used to provide current for the load 90 in the event that the supply voltage Vin momentarily drops out. The load current sense circuit 55 generates a signal proportional to the current flowing through M1. The current limit circuit 60 receives the signal from the load current sense circuit 55 and turns off M1 upon detection of an over-current condition.

M1 in this example comprises an n-type metal oxide semiconductor field effect transistor (NMOS), although other types of power transistors can be used instead. The drain of M1 is coupled to the voltage supply Vin and the source of M1 couples to the load 90 and output capacitor Cout. The gate of M1 is controlled, at least in part, by the controller 50. Thus, the controller 50 can turn on M1 to power the load 90 and charge the output capacitor Cout. Before M1 is turned on, the voltage across the capacitor is 0 V and thus the source of M1 is at 0V. The drain of M1, however, is at the Vin voltage (e.g., 60 V). Even though M1 has a large voltage drop between its drain and source (Vds), no, or very little, power is dissipated in M1 because M1 is off and thus conducts no, or very little current.

However, as soon as the controller 50 turns M1 on, current from the voltage source Vin starts to flow into the upper plate of the output capacitor Cout and the voltage across Cout (i.e., Vout) begins to rise linearly. At the instant that M1 is turned on to begin powering the load 90 and charging Cout, the Vds of M1 is equal to about Vin (as Vout is initially at 0 V). A substantial load current (Iload) can be made to flow through M1 as a function of the size of M1 (i.e., the width to length ratio of its channel), the gate voltage created by the controller 50, and other parameters. In one example, Iload is 2 A. With a Vds equal to Vin and a drain current (Iload) of 2 A, the power dissipated in M1 is Vin*Iload. At a Vin of 60 V, the power dissipated in M1 is 120 watts in this example. The internal core temperature of M1 is a function, at least in part, of the power dissipated by M1. At 120 watts, the internal core temperature will be substantially high. Vout, however, increases linearly, which causes the Vds of M1 to decrease. Thus, the power dissipated in M1 begins to decrease. However, for large values of Cout the initial inrush of current through M1 to charge Cout may sustain for a relatively long time and may cause the internal temperature of M1 to become too high (e.g., exceeds a temperature rating) before the power dissipated in M1 drops sufficiently. The thermal response of M1 is a significantly slower process than the electrical current and voltage change of M1. That is, Iload can be made to increase and decrease through M1 much faster than the response time of the thermal properties of M1. In some implementations Cout is "hiccup" charged, that is charged in short duration bursts of current. Following a short duration flow of current to Cout, M1 is turned off when M1's core temperature reaches the maximum allowable limit to thereby let its temperature drop, and the charging process repeats over and over until Cout is fully charged. This scheme for output capacitor charging takes more time than is desirable for some applications and also leads to electromagnetic interference and other issues regarding electromagnetic compatibility with other circuits due to the pulsed nature of the current.

The system 100 of FIG. 1 includes a temperature sense circuit 65 and a thermal shutdown circuit 70. The temperature sense circuit 65 may comprise a bipolar junction transistor (BJT) based proportional to absolute temperature (PTAT) circuit in or near the core of M1. The temperature sense circuit 65 produces an output signal to the thermal shutdown circuit 70. The thermal shutdown circuit 70 is connected to the gate of M1 and thus can directly control the gate-to-source voltage (Vgs) of M1. Once the thermal shutdown circuit 70 determines the temperature of M1 to be greater than a threshold, the thermal shutdown circuit 70 shuts off M1 to prevent damage to M1.

Figure 2:
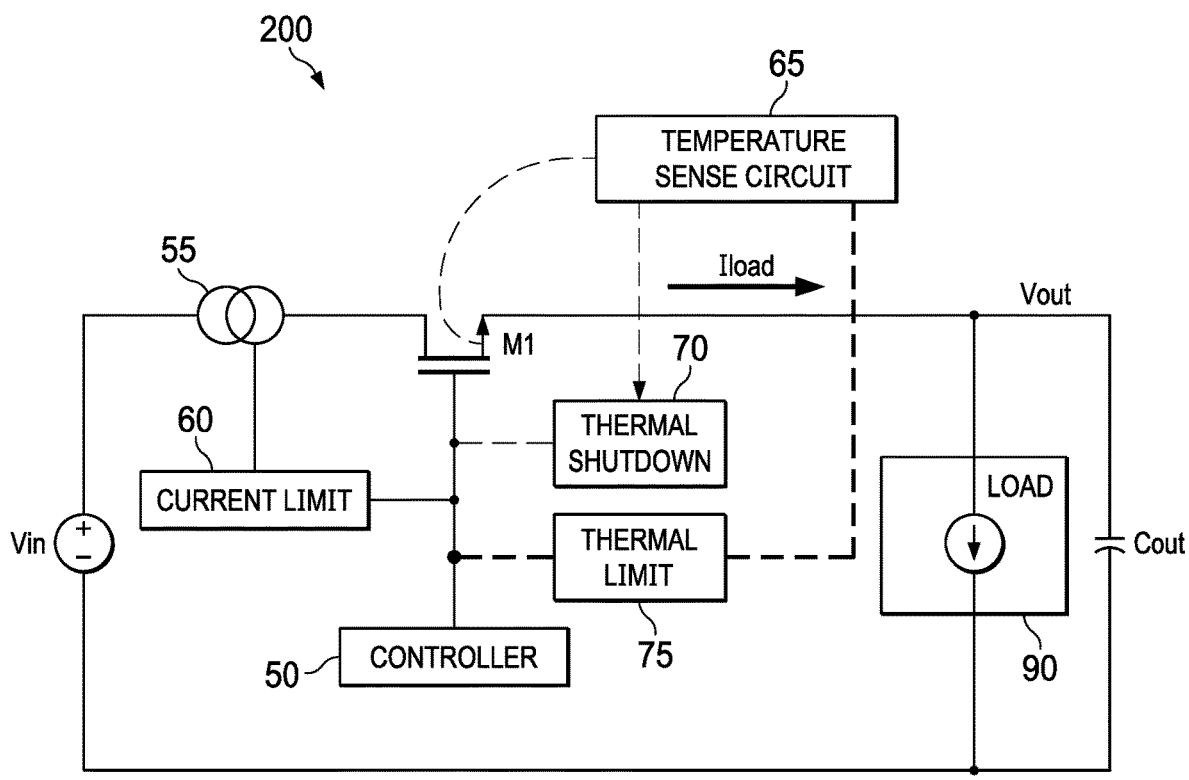
FIG. 2 illustrates another architecture of a system for providing power to a load and charge current to an output capacitor.

FIG. 2 shows another possible implementation of a system 200, similar to that of FIG. 1. One difference between system 200 of FIG. 2 and system 100 of FIG. 1 is that system 200 includes a thermal limit circuit 75, whereas FIG. 1 does not. The thermal limit circuit 75 also receives a temperature signal from the temperature sense circuit 65 and controls the voltage on the gate of M1. Whereas the thermal shutdown circuit 70 is operative to turn off M1 to prevent an over-temperature condition, the thermal limit circuit 75 provides a variable gate voltage for M1 to control the amount of drain current flowing through M1 as Iload. By controlling the magnitude of Iload, the temperature generated by M1, as Iload increases, can be regulated to a safe upper limit. Moreover, as the thermal limit circuit 75 limits the maximum temperature generated by M1 to a maximum, constant level, Cout can be charged without having to repeatedly turn off and back on M1 to prevent its temperature from exceeding the maximum rating of the transistor.

The change in heat generated by M1 as a result of its power consumption is a fairly slow process, that is, a process by which there is a fairly long delay between an increase in power consumption and a resulting increase in temperature of M1. Thus, the control loop characteristic of this circuit has a low frequency pole associated with this thermal delay. Further, as M1 is a relatively large transistor (i.e., large channel width (W) to achieve very low on-resistance), the gate capacitance of M1 is relatively large and the gate of M1 has a relatively large impedance. Consequently, a second low frequency pole is also present in the example of FIG. 2. With two low frequency poles, the control loop operation of the system 200 may be unstable or very challenging to compensate and stabilize at that low frequency.

Figure 3:
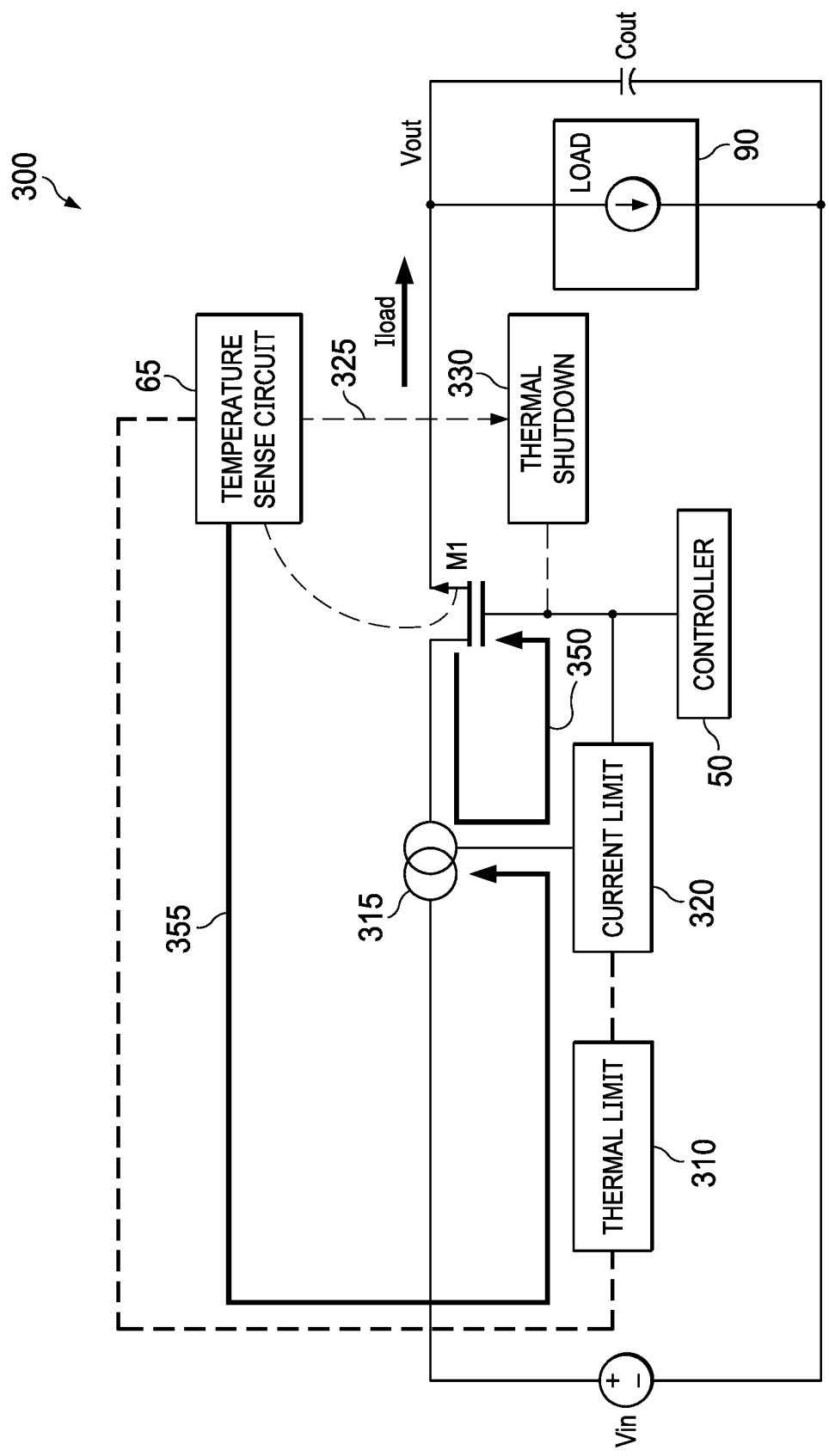
FIG. 3 illustrates yet another architecture of a system for powering a load and charging the output capacitor that is stable.

FIG. 3 shows an example of a system 300 which includes the voltage source Vin, the power transistor M1, the controller 50, a load current sense circuit 315, a current limit circuit 320, a temperature sense circuit 65, a thermal limit circuit 310, a thermal shutdown circuit 330, a load 90, and an output capacitor Cout. The controller 50 controls the operation of M1 to turn power on to the load 90 and Cout as noted above. The temperature sense circuit 65 senses the temperature of M1 and provides a temperature sense signal 325 to the thermal shutdown circuit 330. Thermal shutdown circuit 330 turns off M1 upon detecting a temperature sense signal 325 that indicates a temperature in excess of a safety temperature threshold.

The current limit circuit 320 functions much as described above regarding current limit circuit 60 of FIGS. 1 and 2 in response to a current sense signal from the current sense circuit 315. In FIG. 3, the thermal limit circuit 310 is connected to the current limit circuit 320, rather than to the gate of M1 as otherwise was the case of FIG. 2. Because the output of the thermal limit circuit 310 does not provide a control feedback signal directly to gate of M1, which represents a high impedance and high capacitance node, a second low frequency node is not present in the example of FIG. 3. In FIG. 3, two nested control loops are present. An inner control loop 350 is responsive to load current and an outer control loop 355 is responsive to temperature. The current limit circuit 320 represents a high frequency pole (which is the unity gain bandwidth of the inner current limit control loop) to the thermal limit circuit 310 (rather than the low frequency pole at the gate node of M1 as in the case of FIG. 2) and thus the second low frequency node of FIG. 2 is not present for the architecture of FIG. 3. Avoiding two low frequency poles in the architecture of FIG. 3 means that the circuit is much easier to stabilize (because single dominant pole systems may be inherently stable or at least easy to compensate). The use of the thermal limit circuit 310 also permits the output capacitor Cout to be continually charged until reaching its full charge without M1 over-heating and thus without having to hiccup-charge Cout (as otherwise was the case for FIG. 1).

FIG. 3 may be implemented as a nested multi-loop architecture where the output of the outer thermal limit loop 355 controls the reference input of the inner current limit loop 350. In at least some examples, the inner current limit loop 350 compares the reference input from the output of thermal limit circuit 310 and the feedback input from current sense circuit 315 using a current limit amplifier, which thereby decides on the gate drive required for M1. For high ambient temperature or high power dissipation or after a long period of time at thermal regulation, the maximum allowable current through M1 required to regulate the core temperature of M1 below thermal safe operating area (SOA) limit is very low. If the reference input (output of thermal limit circuit 310) is reduced to a low value to achieve the low current regulation required, the noise and offset of the current limit amplifier will dominate rather the low amplitude of input signals. Thus, the current limit loop 350 will fail to regulate at such low current levels and thus fail to maintain temperature regulation at the low common mode condition. Also, the current limit amplifier should be designed for wide range on common mode signal which complicates the design of the current limit circuit 320. So, the disclosed examples include a fixed common mode, multi-loop temperature dependent, current limit loop architecture in which the thermal limit circuit 310 provided the temperature input from the feedback side of the current limit circuit 320 and the reference of the current limit circuit 320 is kept constant.

Figure 4:
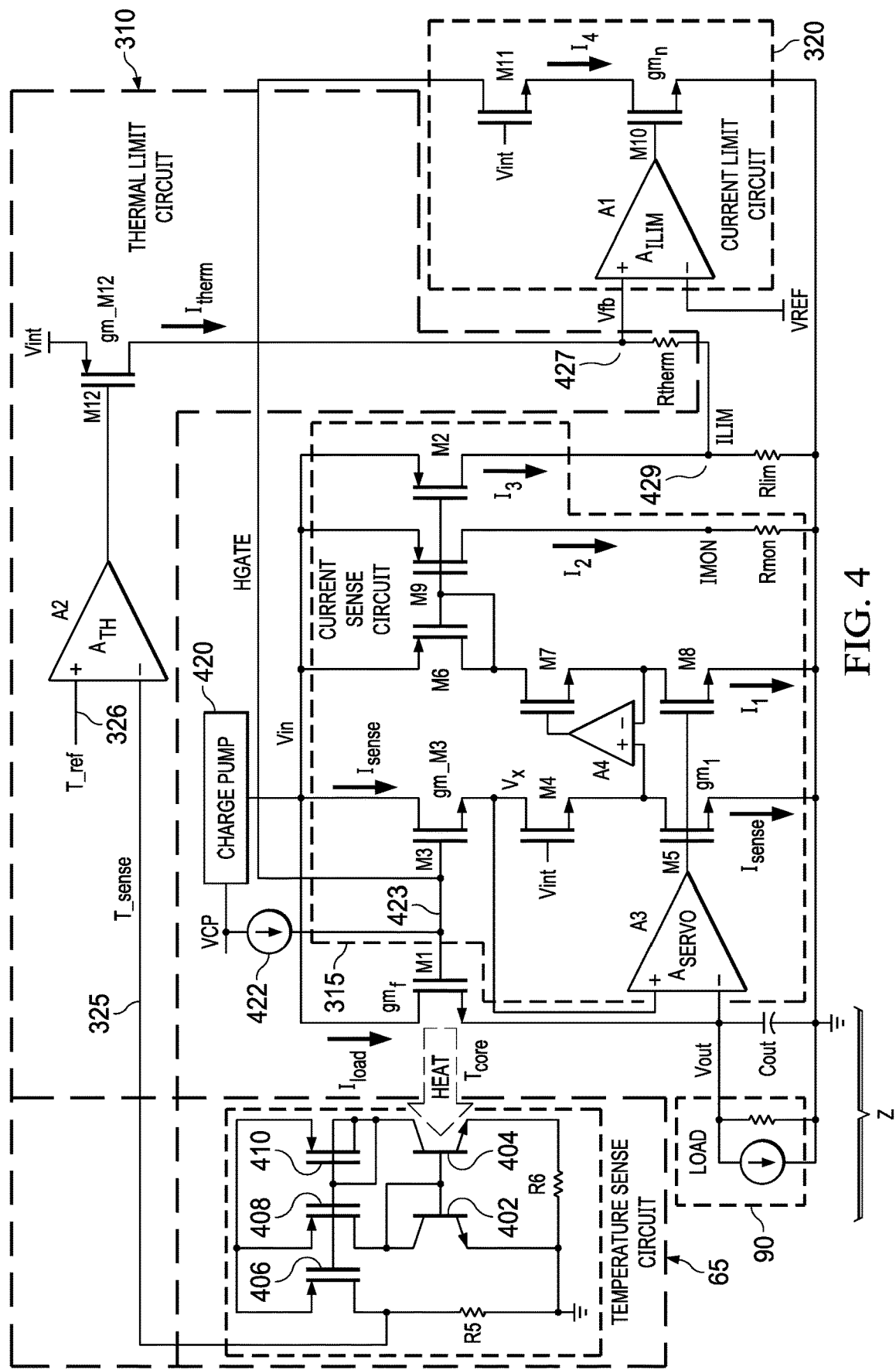
FIG. 4 shows a circuit implementation of the architecture of FIG. 3

FIG. 4 shows an example of an implementation for some of system 300 of FIG. 3. The example implementation of FIG. 4 includes the power transistor M1, current sense circuit 315, current limit circuit 320, current limit resistor Rlim, "thermal" resistor Rtherm, a charge pump 420, a current source 422, thermal limit circuit 310, temperature sense circuit 65, load 90, and output capacitor Cout. The thermal limit circuit 310 includes an amplifier A2 and a transistor M12. An example temperature sense circuit 65 may be implemented as a BJT-based proportional to absolute temperature (PTAT) sensor circuit which includes resistors R5 and R6, and transistors 402, 404, 407, 408, and 410. Transistors 402 and 404 have equal emitter current due to current mirror 408 and 410, but emitter area of 404 is larger than 402 ('n' times larger). Therefore, the emitter current density is lower in 404 and thus the base to emitter voltage (VBE) is lower for 404 than for 402. The difference of the base to emitter voltage of 402 relative to that of 404 (delta_VBE) is proportional to absolute temperature (T) and can be ideally represented as delta_VBE=(KT/q)*ln(n) (here K is Boltzmann's constant and q is the charge of an electron). This delta_VBE voltage is applied across R6 to generate a current proportional to absolute temperature (PTAT current) through R6 and 410, which is mirrored using 406. As a result, the voltage drop across R5 and thus T_sense 325 from the temperature sense circuit 65 comprises a voltage that is proportional to the internal core temperature of M1.

The amplifier A2 amplifies the difference between T_sense 325 from the core sensor 325 and T_ref 326. T_ref 326 is a reference voltage that is set based on the maximum allowable temperature without violation of a specified thermal safe operating area (SOA) of M1. The output of A2 controls the gate of M12. The combination of A2 and M12 comprises a transconductance amplifier which generates a current, Itherm, that is proportional to the heat generated by M1. Itherm flows through the series connection of Rtherm and Rlim to the ground node.

The current sense circuit 315 in FIG. 4 includes transistors M2, M3, M4, M5, M6, M7, M8, and M9, amplifiers A3 and A4, and resistor Rmon. M2-M9 are shown as n-type or p-type metal oxide semiconductor field effect transistors (MOSFETs), but can be implemented as other types of transistors as desired. The same is true for the other transistors shown in FIG. 4—MOSFETs can be substituted for BJTs, BJTs substituted for MOSFETs, n-type MOSFETs substituted for p-type MOSFETs, etc. M1 and M3 are connected so as to mirror M1's current in M3, along with the help of amplifier A3. As such, M3 is also referred to as a SenseFET. Amplifier A3 includes a positive input and a negative input. The negative input is connected to Vout (and to the source of M1) and the positive input is connected to the source of M3. A3 amplifies the difference between the source voltages of M1 and M3, and controls the gate of M5 in response to the difference between the M1 and M3 source voltages to provide a control loop that maintains the source voltage of M3 approximately equal to the source voltage of M1. The size of M3 is a fraction of the size of M1. In one example, M1 is 8000 times larger than M3. The current that flows through M1 is the load current Iload, and the current that flows through M3 is Isense. Due to the size ratio of M1 to M3, Isense is proportional to, but smaller than, Iload. Isense is the same proportion of Iload that the size of M3 is to M1. Due to the control loop implemented by A3 and M5, Isense is regulated to be a constant fraction of Iload. M4 is biased by a constant internal voltage Vint and protects the drain-to-source voltage of M5 from being too large.

M5 is coupled to M8 in another current mirroring configuration. Amplifier A4 functions in a similar manner to A3 to amplify the difference between the drain voltages of M5 and M8 and control the gate of M7 connected in series with M8 to make the drain voltage of M5 and M8 approximately equal and thus mirror the M5 current to M8 in saturation as well as linear regions. As a result, I1 (drain current through M8) is regulated to remain a constant proportion of Isense. I1 may be equal to Isense if M5 and M8 have the same size, or I1 may be a fraction of Isense if M8 is smaller than M5. M6 and M9 as well as M6 and M2 are also connected in current mirror configurations and thus I2 through M9 is of the same magnitude as I1 through M6 (assuming the size of M9 equals the size of M6), and I3 through M2 is of the same magnitude as I1 (also assuming the size of M2 equals the size of M6). As such, I3 through M2 is proportional to Isense through M3 and Isense is proportional to Iload through M1. Depending on the current mirror ratios implemented across M5/M8 and M6/M9/M2, I3 may be the same as Isense or a constant fraction of Isense. Rmon may comprise an externally connected resistor that is usable to provide a measure of ILOAD current to an external device, such as a microprocessor.

As noted above, Itherm (which is a function of M1's internal temperature) flows through Rtherm and Rlim to ground. Further, the sum of I3 (which is a function of Iload) and Itherm flows through Rlim. One terminal of Rtherm is connected to the drain of M12 at node 427, and the opposing terminal of Rtherm is connected to node 429 which interconnects the drain of M2 and a terminal of Rlim. The voltage on node 427 is designated as Vfb.

The current limit circuit 320 in the example of FIG. 4 includes amplifier A1 and transistors M10 and M11. Amplifier A1 includes a positive input and a negative input. The positive input is connected to node 427 and thus receives voltage Vfb. The negative input of amplifier A1 is connected to a reference voltage VREF. The output of A1 drives the gate of M10. The source of M10 is connected to the ground node and the drain of M10 is connected to the source of M11. The drain of M11 is connected to the gate of the power transistor M1. The gate of M11 is biased at the same VINT voltage as M4.

Vfb is the voltage drop across the series connected resistors Rtherm and Rlim. The voltage drop across Rlim is the resistance of Rlim times the sum of currents I3 and Itherm. The voltage drop across Rtherm is the resistance of Rtherm times Itherm. Consequently, $$Vfb = R\text{lim}(I3 + I\text{therm}) + R\text{therm} * I\text{therm} \quad (1)$$

which can be rewritten as:

$$Vfb = I3*(R\text{lim}) + I\text{therm}*(R\text{lim} + R\text{therm}) \quad (2)$$

The resistances Rlim and Rtherm are constants and thus Vfb is a function of I3 and Itherm. Alternatively stated, Vfb is a function of the load current and the temperature of M1. As A1 amplifies the difference between Vfb and VREF, the gate of M10 is controlled based on the load current and based on M1's temperature. The current through M10 (I4) is controlled by the voltage on the gate of M10.

Resistor Rtherm is an internally-provided resistor (i.e., internal to the semiconductor die containing the transistors and amplifiers), whereas Rlim may be an externally-connected resistor. Increasing the resistance of Rtherm adds insensitivity to the thermal gain. As such, the change of thermal circuit bandwidth can be made to not vary drastically with different values of Rlim.

By sinking current from node 423 interconnecting the gates of M1 and M3, the voltage on the gate of M1 can be controlled, at least in part, by the current I4 through M10. For example, as internal core temperature of M1 rises, Itherm also rises which in turn causes Vfb to increase per Eq. (2) above. As Vfb increases, the voltage on the gate of M10 increases thereby causing I4 to increase. An increase in I4 causes the voltage on node 423 to decrease, which then causes a decrease in current Iload through M1. A decrease in Iload causes the internal temperature of M1 to decrease. If the Iload current were to, for example, increase, I3 will also increase which also causes an increase in Vfb. As explained above, an increase in Vfb will ultimately cause a decrease in Iload through the control loop implemented by the current limit circuit 320. As such, Iload can be controlled to maintain a constant temperature in the face of changes in the internal temperature of M1 and the load current Iload.

Figure 5:
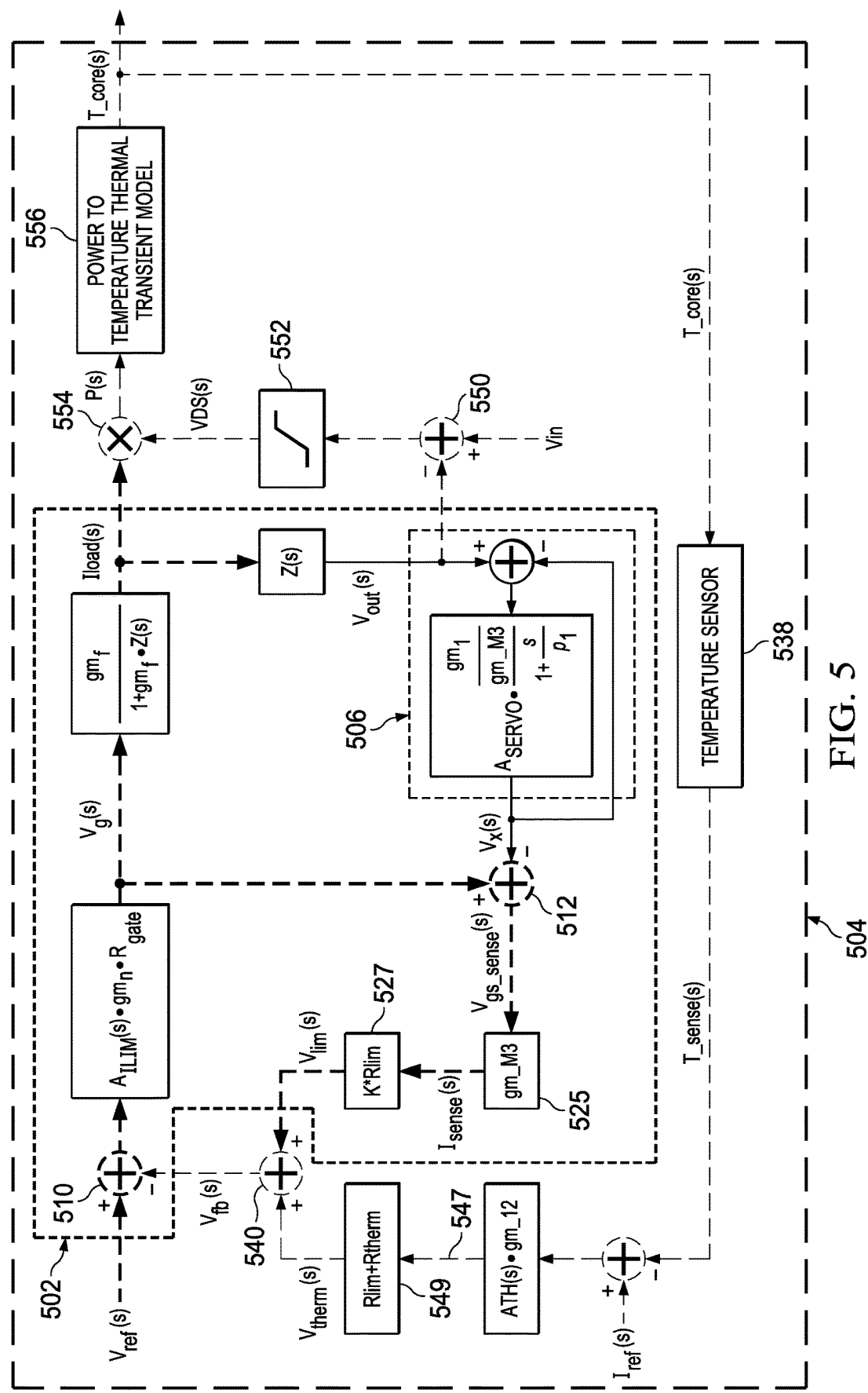
FIG. 5 shows the control system block diagram model of the implementation of FIG. 4

FIG. 5 shows a control loop diagram representation for the circuit of FIG. 4. Three control loops are shown in FIG. 5—a current limit control loop 502, a thermal limit control loop 504, and a servo control loop 506. The current limit control loop 502 includes and adder 510, which adds inverted Vfb(s) (−Vfb(s)) to Vref(s). The resulting signal from adder 510 is converted to signal Vg(s) based on the gain of amplifier A1 (Alim(s)), the transconductance of M10 ($gm_n$), and the effective resistance at the gate node of M1 ($R_{gate}$). Vg(s) is equal the product of Alim(s), $gm_n$, and $R_{gate}$. The load current Iload(s) represents the product of Vg(s) and gmf/(1+gmf*Z(s)) (transfer function 521), where gmf is the transconductance of M1 and Z(s) is Laplace equivalent of the load impedance connected to VOUT. Vg(s) is added (via adder 512) to −Vx(s) from the servo control loop 506 to produce the signal VGS_sense(s) and VGS_sense(s) is converted to Isense(s) by the transconductance of M3 at 525. The voltage across Rlim is determined as Isense(s) multiplied by k*Rlim at 527, where k is the current mirror ratio from Isense to I3, and added to Vtherm(s) at adder 540.

In the thermal limit control loop 504, the T_sense(s) signal from the temperature sensor 538 is inverted and added to T_ref(s), and the resulting sum is then amplified by the product of ATH(s) (gain of A2) and the transconductance of M12 (gm_M12). The signal 547 is then converted to a voltage by multiplication by the sum of Rlim and Rtherm at 549. Adder 550, non-linear saturation function 552 and multiplier 554 represent the power generated and dissipated in M1 (P(s)) due to load current of Iload(s) from drain to source and drain voltage of VIN. The transient power to temperature model 556 is the thermodynamic representation of heat generation and temperature rise in the core of M1 due to power dissipated in M1, and is not actual electrical circuit components. The block 556 may be modelled as a RC network equivalent which models the temperature of the core of M1 (T_core(s)) as a function of the power generated in M1 (P(s)), which also depends on the layout of M1, mold compound, die attach and other materials, packaging and PCB layout. The core temperature T_core(s) is multiplied by the gain of the temperature sensor 538 to get the temperature sense voltage T_sense(s).

Figure 6:
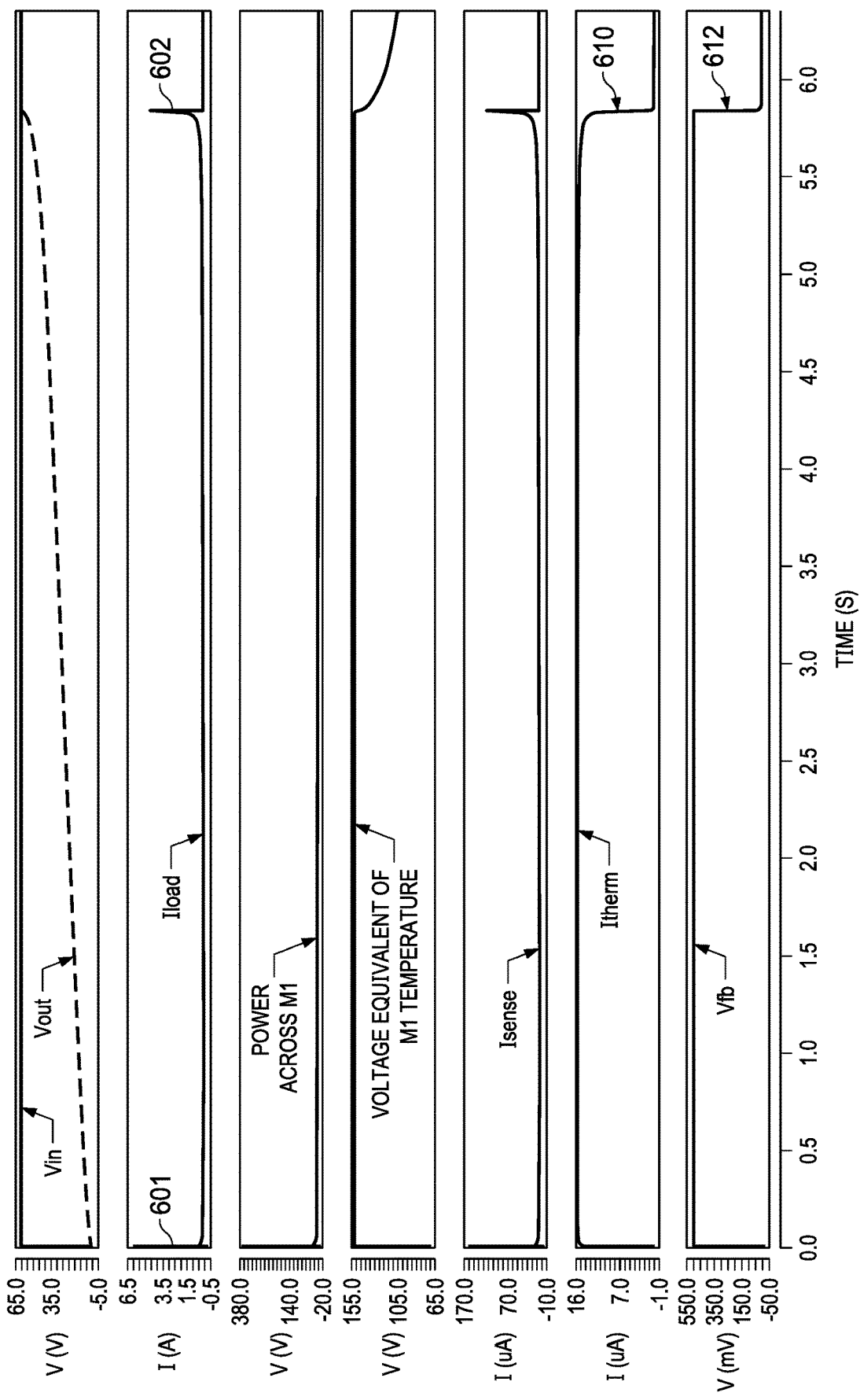
FIG. 6 shows the correlation of transient oscillation and Nyquist stability and the stabilization process of the architecture of FIG. 4.

FIG. 6 illustrates the time progression of Vin, Vout, Iload, Isense, Itherm and Vfb, as well as the power dissipation across M12, and the temperature generated by M1, upon a power start-up event at time 0.0. Vin is shown at a constant level following the power start-up event, while Vout ramps up from a low voltage to a final level approximately equal to Vin. The load current Iload remains fairly constant initially due to the current limit circuit 320 as described in FIG. 4. Due to high difference between VIN and VOUT and high initial current Iload, the initial power dissipated in M1 is high, which leads to a rapid rise in the temperature of M1. As M1 temperature reaches the maximum allowable temperature of M1 as per the thermal SOA limit, the thermal limit circuit 310, as described in FIG. 4, causes adequate Itherm to be sourced to node Vfb. As the current limit circuit 320 of FIG. 4 regulates the node Vfb approximately equal to VREF (500 mV in the example of FIG. 6), the increase in Itherm leads to appropriate reduction in I3 (as per equation 2) and thus proportionately in Isense and Iload. This leads to a sharp reduction of Iload as shown at 601 and it is regulated to a much lower current in order to regulate the M1 temperature to the maximum allowable limit. As the drain to source voltage of M1, which is the difference between VIN and VOUT, reduces as output capacitor charges, higher Iload current can pass through M1 in order to maintain the same power dissipation and thus the same M1 temperature. As such, at the end of the Cout charging cycle, Iload again increases (602) to the current limit directed by current limit loop 320 as thermal limit loop relinquish control. The power drop across M1 reduces very slowly even though M1's temperature remains constant due to the thermal circuit transient response based on thermal resistance and heat capacity of the thermal path. Once Vout reaches Vin, the output capacitor is fully charged and the load current Iload and correspondingly Isense drops to zero at the end of charging cycle. Correspondingly, M1's temperature begins to decrease after charging and thus Itherm also drops as shown at 610 as well as Vfb as shown at 612.

Figure 7:
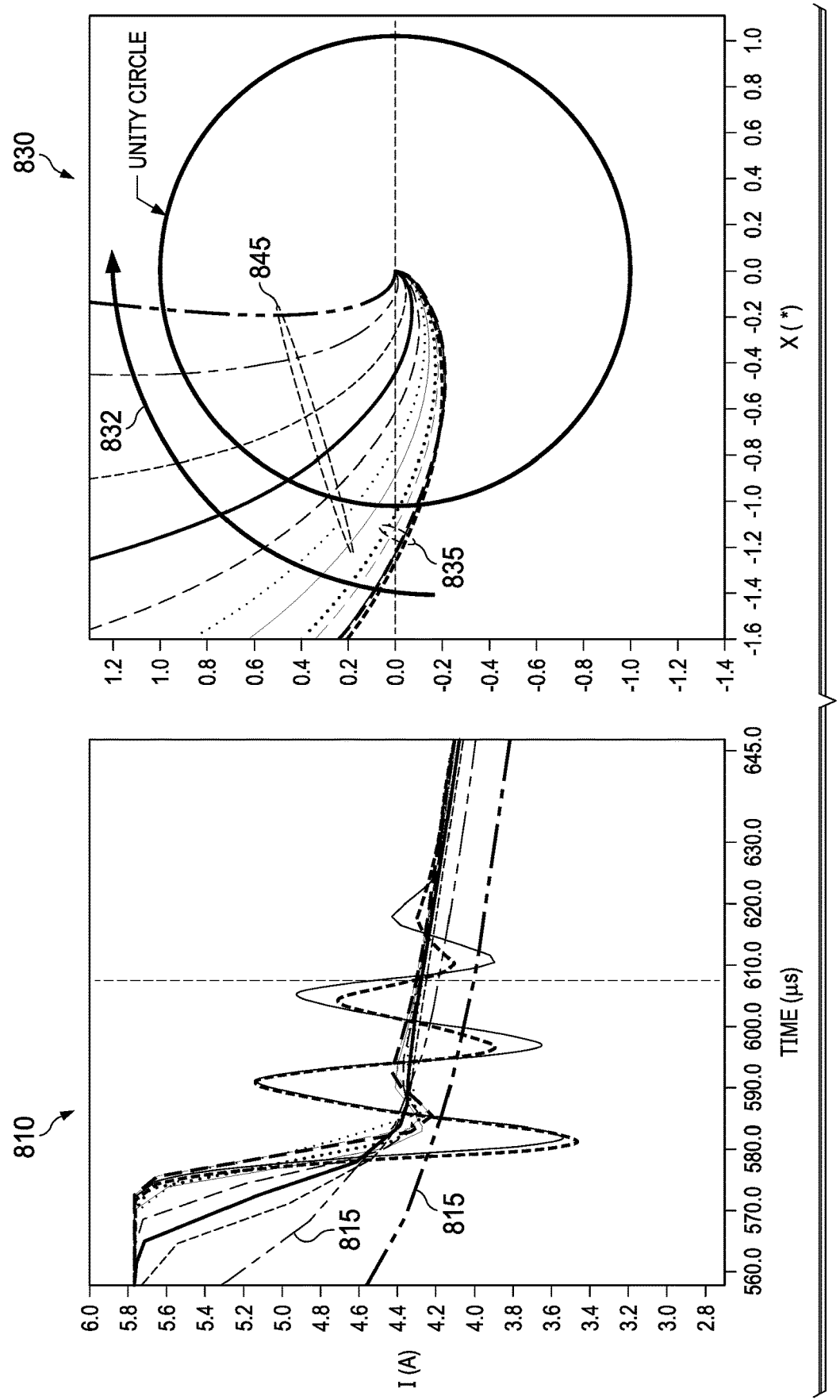
FIG. 7 shows the effect on phase margin and stability of different gain settings.

FIG. 7 shows Nyquist plots for different gain configurations of amplifier A2. If a given Nyquist plot encircles the (−1, j0) point (on the unity circle) counter-clockwise, the circuit is unstable for that operating point. The angle created by the intersection of the Nyquist plot and the unity circle with the real axis (x-axis) is the phase margin. If the system is unstable for a given operating point, the gain of amplifier A2 can be reduced to reduce the overall gain of the thermal limit loop and thus reduce its bandwidth. Counterclockwise pointing arrow 832 represents the progression of the Nyquist plots from higher gains of amplifier A2 to lower gain values. As can be seen in FIG. 7 from Nyquist plots 830, the Nyquist plots 835 encircle (−1, j0), but further decreasing the gain of amplifier A2, the plots 845 do not encircle (−1, j0) indicating positive phase margins thus representing stable configurations. Plots 810 represent load current transient response at the corresponding amplifier A2 settings of the Nyquist plots. As can be seen in plots 810, as phase margins transitions from negative to positive, and then to further increasing positive phase margins, the oscillations in the transient waveforms reduce and, after a particular phase margin, cease altogether (e.g., transient waveforms 815.

In this description, the term "couple" or "couples" means either an indirect or direct connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

What is claimed is:

1. An apparatus, comprising:
   a power transistor to conduct a load current from a supply voltage node to an output node;
   a current sense circuit coupled to the power transistor, the current sense circuit to generate a current sense current proportional to the load current;
   a temperature sense circuit to generate a temperature sense voltage proportional to the temperature of the power FET, the temperature sense circuit having a proportional to absolute temperature (PTAT) element that senses an internal core temperature of the power transistor;
   a thermal limit circuit coupled to the temperature sense circuit; and a current limit circuit coupled to the current sense circuit and to the thermal limit circuit, the current limit circuit to generate a control signal on a current limit circuit output node, the control signal responsive to the current sense current and to a first current from the thermal limit circuit, the current limit circuit output node coupled to a control input of the power transistor.

2. The apparatus of claim 1, wherein the thermal limit circuit comprises a transconductance amplifier to generate the first current and wherein the current limit circuit generates the control signal based on both the current sense current and the first current.

3. The apparatus of claim 1, further comprising a limit resistor coupled between the current sense circuit and a ground node, the limit resistor to conduct both the current sense current and the first current.

4. The apparatus of claim 3, wherein the thermal limit circuit includes a second resistor coupled to the limit resistor, and wherein the second resistor is to conduct the first current to the limit resistor.

5. The apparatus of claim 4, wherein the current limit circuit includes an amplifier that amplifies a difference between a reference voltage and a voltage on a node of the second resistor opposite a node of the second resistor connected to the limit resistor.

6. The apparatus of claim 4, wherein the thermal limit circuit includes a transconductance amplifier to generate the first current based on a difference between the temperature sense voltage and a reference voltage.

7. The apparatus of claim 1, wherein the current sense circuit includes:
a sense transistor connected to the power transistor; and
an amplifier including a positive input and negative input, the negative input coupled to the output node and the positive input coupled to a current terminal of the sense transistor; and
a third transistor coupled in series between the sense transistor and a ground node, the third transistor having a control input that is coupled to an output of the amplifier.

8. An apparatus, comprising:
a power transistor including first and second current terminals and a first control input, the first current terminal connected to an input voltage node and the second current terminal connected to an output voltage node;
a second transistor including third and fourth current terminals, the third current terminal connected to the input voltage node;
a first resistor having first and second resistor terminals, the first resistor terminal connected to the fourth current terminal and the second resistor terminal connected to a ground node;
a second resistor having third and fourth resistor terminals, the fourth resistor terminal connected to the fourth current terminal and to the first resistor terminal;
a thermal limit circuit having a temperature sense circuit output node, the thermal limit circuit to generate an output signal on the thermal limit circuit output node that is based on a temperature of the power transistor;
a first amplifier including a first input and a second input and a first amplifier output, the first input connected to the thermal limit circuit output node and to the third resistor terminal, and the second input connected to a reference signal node; and
a third transistor including fifth and sixth current terminals and a control input, the control input of the third transistor connected to the first amplifier output, and the fifth current terminal coupled to the control input of the power transistor.

9. The apparatus of claim 8, wherein the thermal limit circuit includes a transconductance amplifier to produce a current having a magnitude that is based on the temperature of the power transistor.

10. The apparatus of claim 8, further including a charge pump circuit having an input and an output, the input of the charge pump circuit connected to the input voltage node and the output of the charge pump coupled to the control input of the power transistor.

11. The apparatus of claim 8, further comprising a temperature sense circuit to generate a temperature sense voltage that is based on the temperature of the power transistor.

12. A system, comprising:
a load;
a capacitor connected to the load;
a power transistor connected to the load and to the capacitor, the power transistor to conduct load current from a supply voltage node to the load and to the capacitor, the current to the capacitor charges the capacitor;
a current sense circuit coupled to the power transistor, the current sense circuit to generate a current sense current proportional to the load current;
a temperature sense circuit to generate a temperature sense voltage proportional to the temperature of the power transistor, the temperature sense circuit having a proportional to absolute temperature (PTAT) element that senses an internal core temperature of the power transistor;
a thermal limit circuit coupled to the temperature sense circuit; and
a current limit circuit coupled to the current sense circuit and to the thermal limit circuit, the current limit circuit to generate a control signal on a current limit circuit output node, the control signal responsive to the current sense current and to a first current from the thermal limit circuit, the current limit circuit output node coupled to a control input of the power transistor.

13. The system of claim 12, wherein the current limit circuit comprises an amplifier to generate the control signal as a current based on both the current sense current and the first current.

14. The system of claim 12, further comprising a limit resistor coupled between the current sense circuit and a ground node, the limit resistor to conduct both the current sense current and the temperature sense current.

15. The system of claim 14, wherein the thermal limit circuit includes a second resistor coupled to the limit resistor, and wherein the second resistor is to conduct the first current to the limit resistor.

16. The system of claim 15, wherein the current limit circuit includes an amplifier that amplifies a difference between a reference voltage and a voltage on a node of the second resistor opposite a node of the second resistor connected to the limit resistor.

17. The system of claim 15, wherein the thermal limit circuit includes a transconductance amplifier to generate the first current based on a difference the temperature sense voltage and a reference voltage.

18. The system of claim 12, wherein the thermal limit circuit includes:
a transconductance amplifier to generate the first current
a first resistor coupled to the limit resistor; and a first resistor connected to an output of the transconductance amplifier.

19. The system of claim 18, wherein the transconductance amplifier includes first, and second inputs, and the first input is coupled to the temperature sense circuit and the second input is coupled to a reference voltage node.

20. The system of claim 12, wherein the current sense circuit includes:
- a sense transistor connected with the power transistor; and
- an amplifier including a positive input and negative input, the negative input coupled to the output node and the positive input coupled to a current terminal of the sense transistor; and
- a third transistor coupled in series between the sense transistor and a ground node, the third transistor having a control input that is coupled to an output of the amplifier.

* * * * *